(12) United States Patent
Thibado et al.

(10) Patent No.: US 11,683,890 B2
(45) Date of Patent: Jun. 20, 2023

(54) REFLOW GRID ARRAY TO SUPPORT LATE ATTACH OF COMPONENTS

(71) Applicant: INTEL CORPORATION, Santa Clara, CA (US)

(72) Inventors: Jonathan W. Thibado, Beaverton, OR (US); Jeffory L. Smalley, Olympia, WA (US); John C. Gulick, Portland, OR (US); Phi Thanh, Hillsboro, OR (US); Mohanraj Prabhugoud, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 890 days.

(21) Appl. No.: 16/227,243

(22) Filed: Dec. 20, 2018

(65) Prior Publication Data

US 2020/0205299 A1 Jun. 25, 2020

(51) Int. Cl.
| | | |
|---|---|---|
| *H05K 3/34* | (2006.01) | |
| *H05K 1/18* | (2006.01) | |
| *H05K 1/11* | (2006.01) | |
| *H05K 1/02* | (2006.01) | |

(Continued)

(52) U.S. Cl.
CPC ............ *H05K 3/3494* (2013.01); *G06F 1/16* (2013.01); *H01L 23/49816* (2013.01); *H05K 1/0201* (2013.01); *H05K 1/0212* (2013.01); *H05K 1/112* (2013.01); *H05K 1/181* (2013.01); *H05K 3/3421* (2013.01); *H05K 2201/10053* (2013.01);

(Continued)

(58) Field of Classification Search
CPC ............ H01L 23/49816; H05K 1/0212; H05K 1/112; H05K 1/181; H05K 2201/10159; H05K 2201/10378
See application file for complete search history.

(56) References Cited

U.S. PATENT DOCUMENTS 7,474,540 B1 * 1/2009 Dang .................. H01L 25/0655
174/250
9,832,876 B2  11/2017 Prakash et al.
(Continued)

FOREIGN PATENT DOCUMENTS

WO  WO-0120957 A1 * 3/2001 ........... B23K 1/0004

*Primary Examiner* — John P. Dulka
(74) *Attorney, Agent, or Firm* — Schwabe, Williamson & Wyatt, P.C.

(57) ABSTRACT

A reflowable grid array (RGA) interposer includes first connection pads on a first surface of a body and second connection pads on a second surface of the body. Heating elements within the body are adjacent to the second connection pads. First interconnects within the body connect some of the second connection pads to the first connection pads. Second interconnects within the body connect pairs of the second connection pads. A motherboard assembly includes first and second components (e.g., CPU with co-processor and/or memory) and the RGA interposer. The first connection pads are in contact with motherboard contacts. The second connection pads are in contact with the first and second components. The first component passes signals directly to the motherboard by the first interconnects. The second component passes signals directly to the first component by the second interconnects but does not pass signals directly to the motherboard by the first interconnects.

24 Claims, 8 Drawing Sheets

(51) Int. Cl.
*G06F 1/16* (2006.01)
*H01L 23/498* (2006.01)
(52) U.S. Cl.
CPC .............. *H05K 2201/10159* (2013.01); *H05K 2201/10378* (2013.01); *H05K 2201/10734* (2013.01)

(56) References Cited

U.S. PATENT DOCUMENTS

2013/0140692 A1* 6/2013 Kaneko .................. H05K 1/032
  174/250
2017/0186661 A1* 6/2017 Aoki ................. H01L 23/49822

* cited by examiner

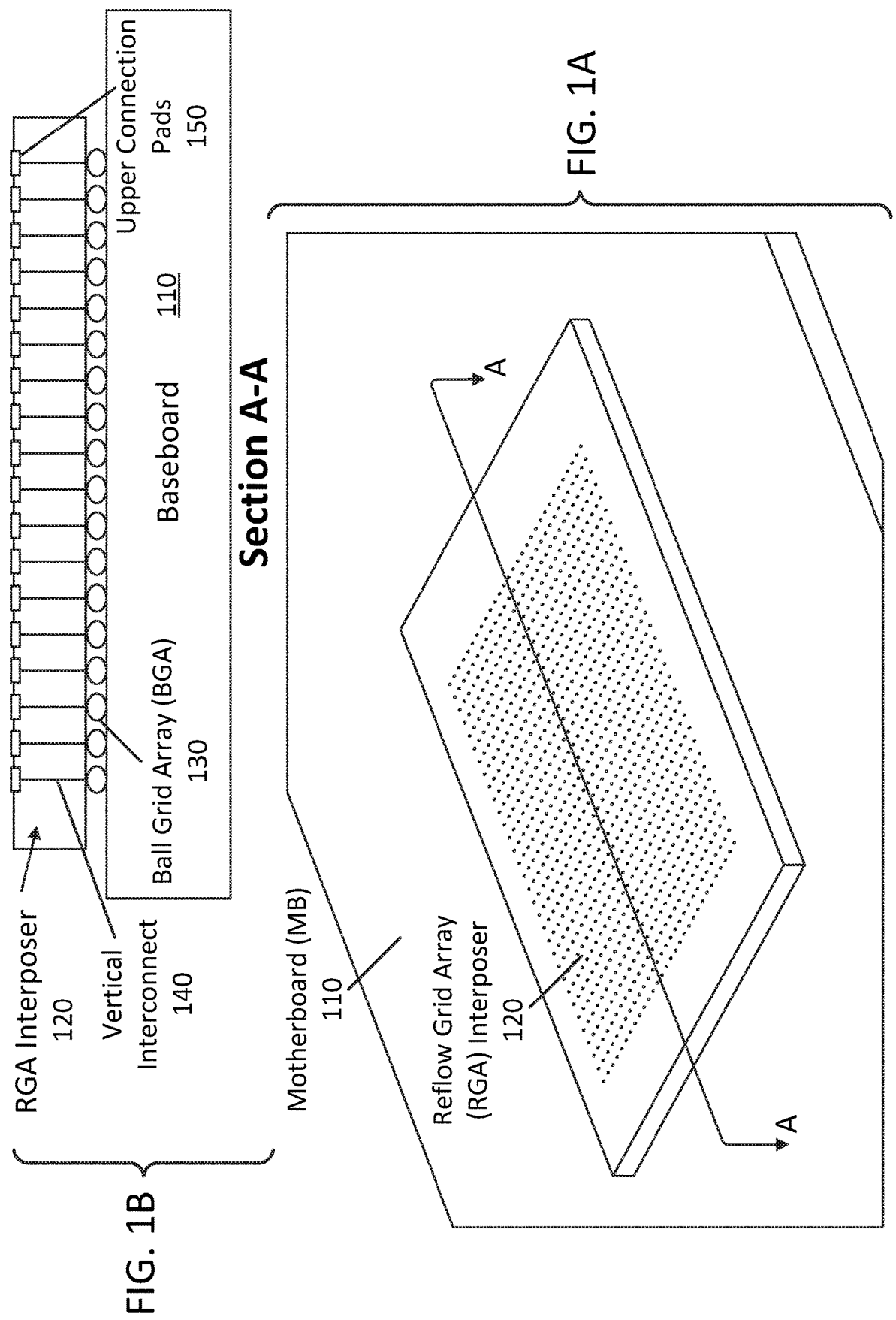

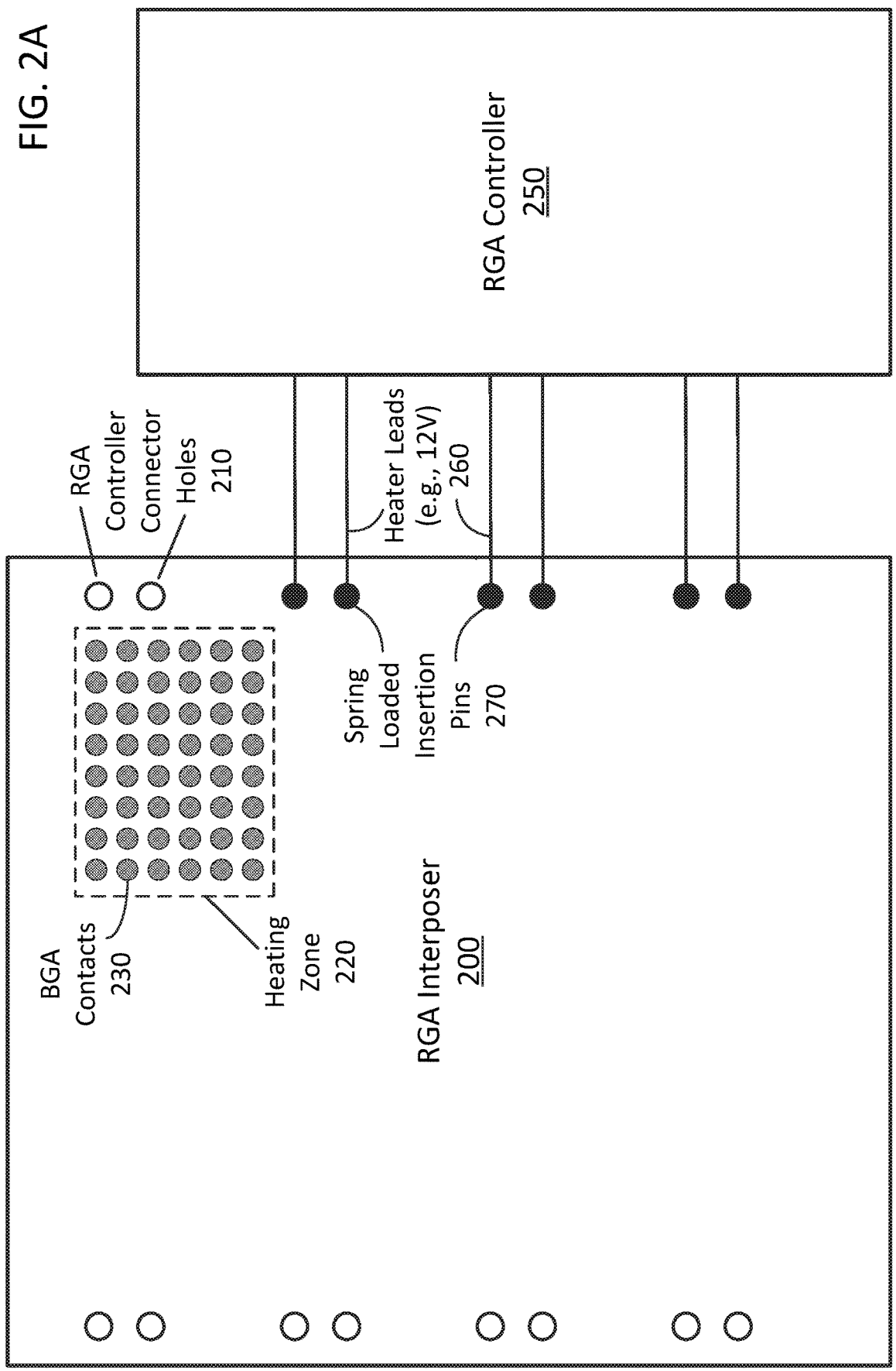

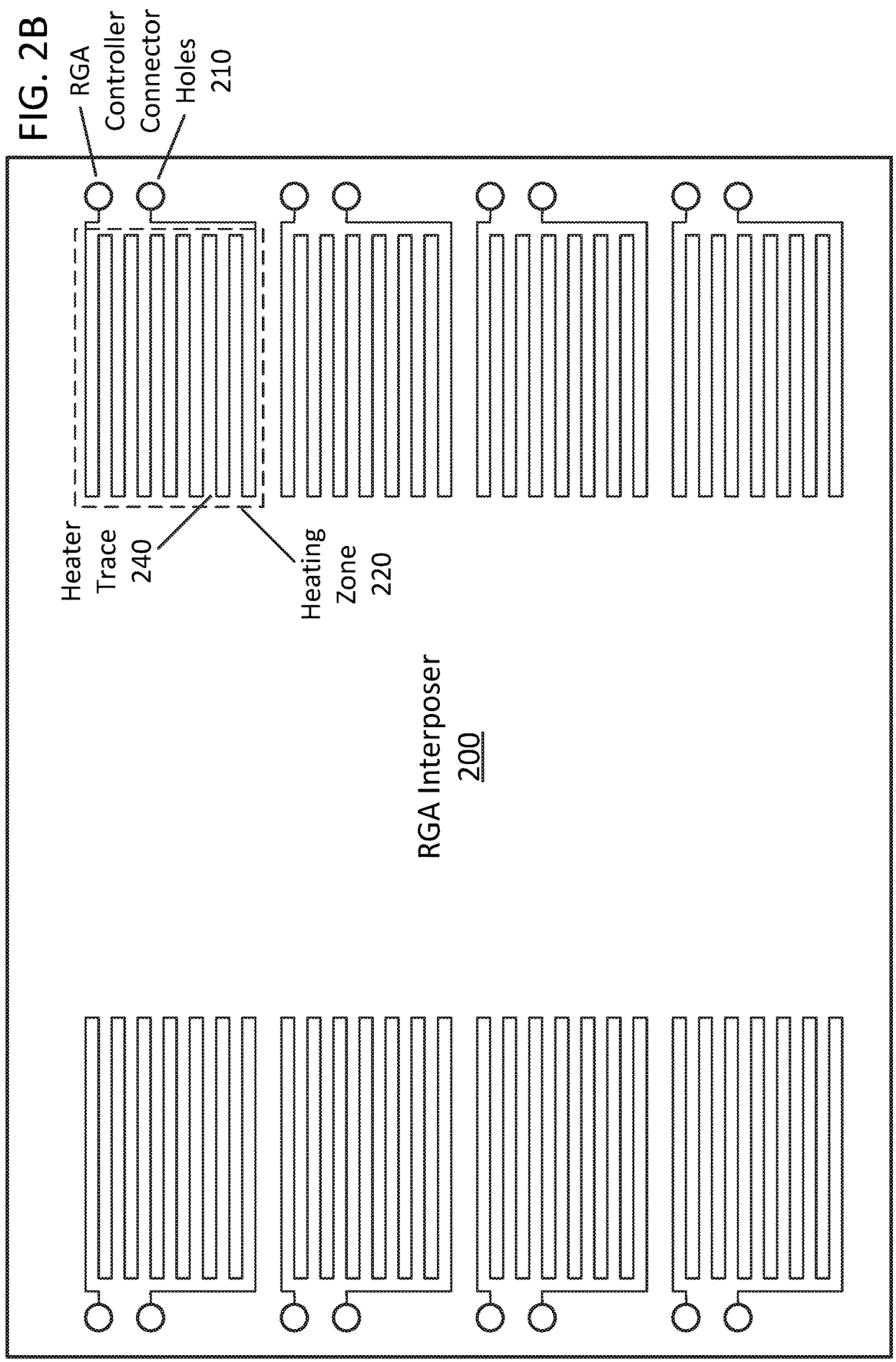

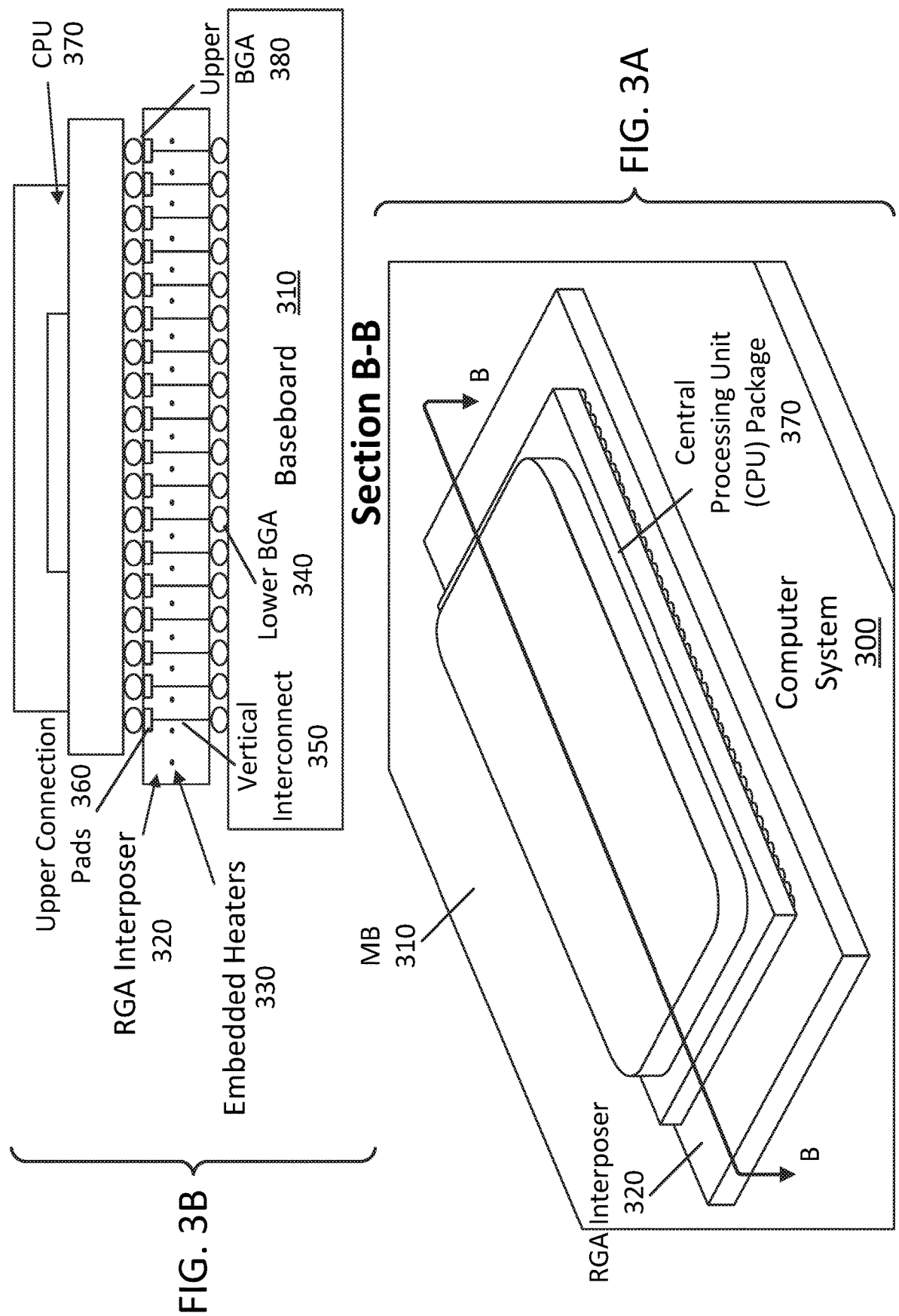

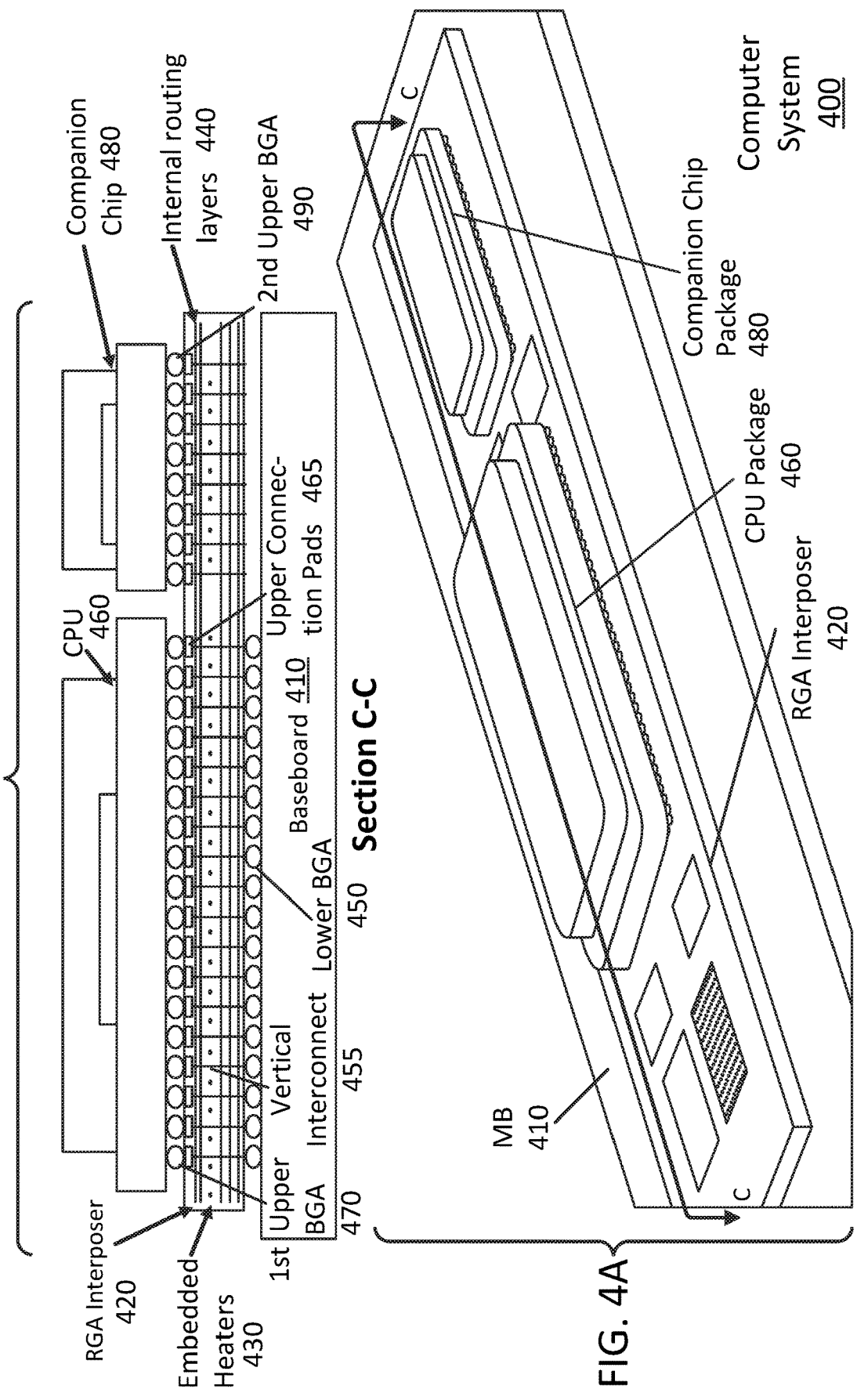

REFLOW GRID ARRAY TO SUPPORT LATE ATTACH OF COMPONENTS

BACKGROUND

Computer packaging technology continues to increase the number and diversity of components placed near one another in a larger package, such as in a multi-chip package (MCP) integrating several component dies in a common microelectronics package, or a motherboard (MB) with numerous companion components. However, there are a number of non-trivial and unresolved issues associated with such component placement. In addition, many of these issues are exacerbated with the increasing number and diversity of such component placement.

BRIEF DESCRIPTION OF THE DRAWINGS

FIG. 1A is a perspective view of an example reflow grid array (RGA) interposer attached to a computer motherboard (MB) or baseboard, according to an embodiment of the present disclosure.

FIG. 1B is an example cross-sectional view of the RGA interposer and baseboard arrangement of FIG. 1A taken along the line A-A, according to an embodiment of the present disclosure.

FIG. 2A is a plan view of an example RGA interposer and RGA controller for selectively heating zones of the RGA interposer, according to an embodiment of the present disclosure.

FIG. 2B is an example cutaway plan view of the RGA interposer of FIG. 2A, according to an embodiment of the present disclosure.

FIG. 3A is a perspective view of a computer system including a central processing unit (CPU) package attached to an example RGA interposer, according to an embodiment of the present disclosure.

FIG. 3B is an example cross-sectional view of the CPU package and RGA interposer arrangement of FIG. 3A taken along the line B-B, according to an embodiment of the present disclosure.

FIG. 4A is a perspective view of a computer system including a CPU package and a companion chip package attached to an example RGA interposer, according to an embodiment of the present disclosure.

FIG. 4B is an example cross-sectional view of the arrangement of FIG. 4A taken along the line C-C, according to an embodiment of the present disclosure.

Figure 5:
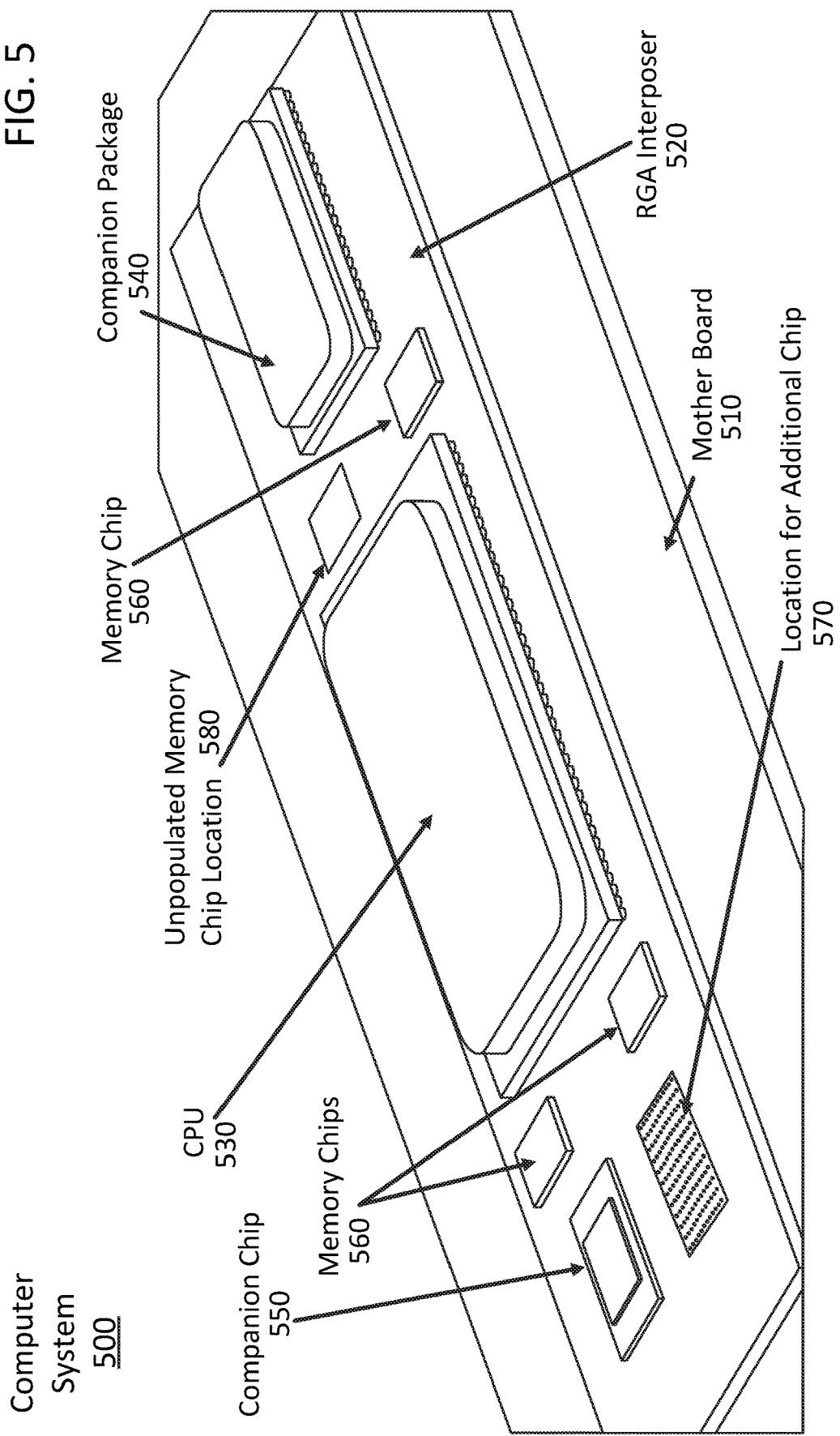
FIG. 5 is a perspective view of a computer system including an example configurable RGA interposer partially populated with companion components, according to an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

A reflowable grid array (RGA) interposer is disclosed, which is particularly useful for enabling late attach of die or components on a baseboard or motherboard (MB) to create a multi-chip package (MCP). The MCP can be integrated into any number of systems, such as a computer system. Such an RGA interposer (or RGA) has selectively reflowable contacts that allow for custom or otherwise arbitrary placement of one or more components such as processors, co-processors, and memory to suit a given design plan or application. In this sense, the RGA can be a relatively inexpensive way to independently late attach multiple dies, packages, or components in close proximity to each other, whether within a given microelectronics package or on a given motherboard or card assembly. Further note that the RGA can be used for selective removal of die, packages, or components. Numerous configurations and applications will be apparent in light of this disclosure.

In more detail, and in accordance with some example embodiments, the RGA uses independent heaters embedded within dielectric material to create local heating zones that can be used to direct-attach (e.g., via solder or other suitable bonding agent) individual components to the RGA without disturbing the attachment of other components or packages previously populated on the RGA, MB, or computer system. Further, the local application of heat reduces the need for global application of heat, which can unnecessarily subject components to heat. In some embodiments, the RGA can marry multiple packages or components together without having signals between the packages/components pass through the MB, but rather pass between the packages/components through an interconnect in the RGA. This can beneficially reduce required connections to the MB, and can further reduce the need for relatively more lengthy signal paths susceptible to parasitics.

In some embodiments, the RGA interposer is made with low loss or ultra-low loss dielectric materials to improve the signal strength and without the expense of having the entire (and larger) MB made from these expensive materials. In some such cases, the dielectric materials have relatively low thermal conductivity, in addition to relatively low electrical conductivity, so as to inhibit heat transfer from one zone to another zone or otherwise assist in containing local heat zones.

Thus, the RGA is a relatively inexpensive way to allow late attach or removal of individual components/chips/packages or even modular boards. With the relatively tight and localized temperature controls of the RGA and attendant reflow processes, traditionally issue-prone processes such as late attach, removal, and repair of components are significantly improved upon to increase downstream configurability as well as yield of good working parts. In some embodiments, the RGA allows for ball grid array (BGA) levels of signal integrity with relatively less expensive printed circuit board (PCB) technology and can allow for late integration of variable configurations increasing adoption of more complex architectures. Numerous embodiments and variations will be apparent in light of this disclosure.

General Overview

As previously explained, there a number of non-trivial and unresolved issues associated with increasing the number and diversity of components placed near one another in a larger package using existing packaging technology. For instance, to increase the performance of processors such as CPUs, it may be desirable to combine or collocate the CPUs with other co-processors or companion components such as field-programmable gate arrays (FPGAs) or graphics processing units (GPUs) to boost the overall performance of server platforms. One technique for this combining of processors with companion dies is to use a multi-chip package (MCP) as part of the standard processor package assembly process. An MCP combines multiple dies or packages and their corresponding interconnect into one package, seemingly allowing a complex high-performing integrated circuit (IC) to be fabricated from several simpler high-performing ICs. However, given the complexity currently involved with integrating multiple chips into a given package, the yield of the resulting MCP decreases with the increasing number of individual dies or packages used to build the MCP. Put another way, the yield loss for each of the chips is additive to the overall package yield loss, making such processes relatively costly. In addition, the resulting cost for a faulty MCP grows with the increasing number of individual dies or packages that make up the MCP (e.g., all the components are lost when the resulting MCP is faulty). This can lead to increased costs associated with MCPs, especially for large numbers of component dies or packages.

Another technique for this combining of processors with companion components is to place these other components near the processor CPU on the motherboard (MB). However, placing companion components near the processor CPU on the MB causes corresponding interconnect complexity that also grows as the number of companion components increases. Here, the interconnect includes things like processor and component sockets as well as MB interconnect wiring, and passes signals between the CPU and the companion components. The sheer number of signals that must pass through the interconnect into the MB can give rise to manufacturing and performance issues, making this type of companion component coupling less favorable. For instance, the signals may need to pass from the CPU through an interconnect into the MB, then travel some distance through the MB before ending up at the companion component. Often this routing distance is too far to achieve the proper signaling strength and speed without boosting the signal with a repeater, which adds bulk and complexity to the overall system. Another way to account for the signal loss and latency is to use specialty material for the MB, either low loss or ultra-low loss material, which are costly when applied to the overall MB form factor.

Thus, interconnect techniques in the form of a reflow grid array (RGA) are disclosed herein. The techniques can be used to, among other things, support late attach of components. In one example embodiment, a computer system includes a motherboard (MB), a reflowable grid array (RGA) interposer soldered to the MB, a central processing unit (CPU) soldered to the RGA interposer, and one or more companion components soldered to the RGA interposer. The RGA interposer includes first connection pads on a first side (such as on the bottom side) of the RGA interposer to solder the RGA interposer to a surface of the MB, second connection pads on an opposite side (such as the top side) of the RGA interposer to solder the CPU and companion components thereon, and heating elements to heat the second connection pads in a selective reflow process when soldering the CPU and companion components. The CPU and one or more companion components are soldered to the RGA interposer through the second connection pads by selectively delivering heat to particular ones of those second connection pads by way of corresponding ones of the heating elements. As will be appreciated in light of this disclosure, each of the heating elements is individually addressable to provide heat to one or more of the second connection pads. The heating elements can be engaged in any order after the RGA interposer is soldered to the MB.

In one embodiment, the RGA interposer further includes first interconnects and second interconnects. The first interconnects (e.g., vertical interconnects) respectively connect ones of the second connection pads to ones of the first connection pads, to enable communication between the CPU and the MB. The second interconnects (e.g., horizontal interconnects) connect pairs of the second connection pads without going through the first connection pads, to enable communication between the CPU and/or the companion components without going through the MB.

In one embodiment, the heating elements include resistance heater traces embedded in substrate material of the RGA interposer. For instance, in some such embodiments, the heater traces can be arranged in serpentine paths corresponding to the second connection pads (e.g., component BGA soldering locations or solder bumps) on the RGA interposer. Other heater trace configurations can be used as well (e.g., linear traces, polygonal traces, zig-zag traces), so long as local heat can be selectively applied to certain ones of the second connection pads. In any such cases, voltage can be applied across the electrodes of a given resistive heater trace that corresponds to the specific second connection pads to be utilized in attaching a given package or component. The applied voltage generates a current within the resistive trace. The current can be controlled by increasing/decreasing voltage across the electrodes to generate localized heat sufficient to, for example, liquify, soften, or otherwise change the phase or characteristics of the bonding agent (e.g., solder) of the second connection pads associated with a given heater trace so that bonding agent creates or removes an attachment and electrical connection to or from the second connection pads.

Note this arrangement may also liquify (or otherwise suitably affect) the bonding agent of the corresponding pads of the component or package being connected, by virtue of the fact that at least some of those corresponding pads are placed in direct (e.g., electrical and physical) contact with corresponding ones of the second connection pads. Withdrawal of the voltage (or current, as the case may be) from a given heater trace allows the liquified (or otherwise transformed) bonding agent to cool, thereby bonding and electrically connecting the package or component in place to the second connection pads of the RGA. Note that each trace can be individually addressed, independent of other traces. Thus, the localized heating scheme can be customized to accommodate any number of component and/or package placement configurations on a given RGA. Note also that this process can be reversed by applying a similar reheating and breaking the attachment (e.g., detaching) and electrical connection, and in some cases, the process can be repeated with the same bonding agent, perhaps multiple times (as with some BGAs).

In addition, in some embodiments, the second interconnects include signal traces in internal routing layers of the RGA interposer substrate material, to connect signals from one component or package to another. In one such example embodiment, the computer system further includes memory chips (e.g., high bandwidth memory) soldered to the RGA interposer through the second connection pads using the corresponding heating elements after the RGA interposer is soldered to the MB. The memory chips communicate with the CPU through the second interconnects and not through the MB.

In one further such embodiment, the computer system further includes local components and remote components. The local components are soldered to the RGA interposer through the second connection pads using the corresponding heating elements after the RGA interposer is soldered to the MB. The remote components are attached to the MB and not to the RGA interposer. The local components communicate with the CPU through the second interconnects and not through the MB, while the remote components communicate with the CPU through the MB and the first interconnects.

In one embodiment, the second connection pads to which the companion component is soldered to the RGA interposer are not connected to the first connection pads to which the RGA interposer is soldered to the MB. In one embodiment, the CPU and the companion component are soldered to the RGA interposer through the second connection pads using the corresponding heating elements after the RGA interposer is soldered to the MB through the first connection pads. In one embodiment, the companion component is a graphics processing unit (GPU) or a field-programmable gate array (FPGA). In another embodiment, the companion component is a voltage regulator, control circuitry, a debug device, security hardware, a local area network (LAN) chip, or a switch.

In another example embodiment, an RGA interposer includes first connection pads to solder a first side of the RGA interposer to a motherboard (MB), second connection pads to solder components including a main component (such as a CPU) to a second side of the RGA interposer, first interconnect to communicatively connect the main component to the MB from the second connection pads to the first connection pads (e.g., vertically), second interconnect to communicatively connect the main component to others of the components (such as a GPU or one or more FPGAs) through the second connection pads and not through the first connection pads (e.g., horizontally), and heating elements (such as corresponding serpentine traces) to selectively solder and to selectively remove the components to and from the second connection pads after the first side of the RGA interposer is soldered to the MB.

In one embodiment, the corresponding heating elements are further to selectively solder and to selectively remove the components to and from the second connection pads in any order after the first side of the RGA interposer is soldered to the MB. In one embodiment, the components are soldered to the second side of the RGA interposer through the second connection pads using the corresponding heating elements after the first side of the RGA interposer is soldered to the MB through the first connection pads. In one embodiment, an example computer system includes the RGA interposer together with the MB, a CPU as the main component, and memory chips as the other components. The first side of the RGA interposer is soldered to the MB through the first connection pads. The CPU and memory chips are soldered to the second side of the RGA interposer through the second connection pads. Baseboard and motherboard are used interchangeably herein, and are intended to both convey an underlying substrate or electronic circuit platform on which an RGA is electrically bonded (by way of solder or other suitable bonding agent).

Architecture

FIG. 1A is a perspective view of an example reflow grid array (RGA) interposer 120 attached to a computer motherboard (MB) 110 or baseboard, according to an embodiment of the present disclosure. FIG. 1B is an example cross-sectional view of the RGA interposer 120 and baseboard 110 arrangement of FIG. 1A taken along the line A-A, according to an embodiment of the present disclosure. The RGA interposer 120 is a substrate that acts as a late attach interconnect between various components (such as a CPU) and the MB 110. For example, the RGA interposer 120 can be fabricated using printed circuit board (PCB) technology or other technology suitable for fabricating the MB 110. The RGA interposer 120 can be fabricated in layers to incorporate a vertical and horizontal interconnect using integrated circuit techniques and low loss or ultra-low loss materials. In some embodiments, the RGA interposer 120 is fabricated from an FR-4 material using copper for the interconnect. The RGA interposer 120 is soldered to the MB 110 through a ball grid array (BGA) 130 connecting a corresponding array of lower connection pads on the bottom of the RGA interposer 120 with an array of connection pads on the top of the MB 110.

The RGA interposer 120 has an array of upper connection pads 150 on the top surface to late attach the CPU and companion components, and a similar array of lower connection pads on the bottom surface to correspond and attach to the BGA 130 (and, by extension, the MB 110). In addition, the RGA interposer 120 has a vertical interconnect 140 (e.g., signal traces for carrying signals between vertically separated connection pads) to connect corresponding ones of the upper connection pads 150 to ones of the lower connection pads. This enables components to be late attached to the top of the RGA interposer 120, using the upper connection pads 150, vertical interconnect 140, and lower connection pads to connect some, all, or none of the corresponding connection pads on the bottom of the CPU and companion components to similar connection pads of the MB 110 as if the CPU and companion components were directly (or more directly) attached (e.g., through BGA 130) to the MB 110.

FIGS. 1A-1B show an RGA interposer 120 that has been attached to a MB 110. The RGA interposer 120 can be fabricated, for example, using standard integrated circuit (IC) fabrication and packaging techniques, such as photolithography. In one example embodiment, the RGA 120 is attached to the MB 110 using the same MB reflow process that is used to attach any other BGA substrate package to the MB as part of the standard MB manufacturing process.

The RGA interposer 120 has resistance heater traces (such as embedded heaters 330 of FIG. 3B) that are embedded in the RGA substrate material. These heater traces are embedded in specific zones on the RGA interposer 120 to allow zone heating of the RGA substrate to solder ball reflow temperatures. For example, in some embodiments, the heater traces are copper wires arranged in serpentine patterns corresponding to the zones, to selectively heat the zones to desired temperatures. Each such serpentine pattern can have two leads (e.g., power and ground) at the perimeter of the RGA interposer 120 to drive a current through the pattern and heat up the corresponding zone. Powering these heaters on the RGA interposer 120 allows direct solder components (such as the CPU) to be individually attached or detached to or from the top surface of the RGA interposer 120 at the corresponding zones and in any order, especially after the RGA interposer 120 is soldered to the MB 110.

Here, the zones (or groups of zones) correspond to the solder locations of the components, allowing attach and removal of individual components in any order by heating the corresponding zone or group of zones. This is done after the standard MB reflow process is complete, thus allowing for late attach or removal of components to and from the MB 110 using the RGA interposer 120 as the interconnect. This can be done, for example, at the MB manufacturing site or at the final integration of the MB 110 into a fully configured system.

In some embodiments, an RGA controller (such as RGA controller 250 in FIG. 2A) is provided. The RGA controller has connections to each of the heater traces (zones), such as power and ground wires to each zone's heater trace (e.g., spring loaded pins to connect to the corresponding holes in the perimeter of the RGA interposer 120 for the different traces). The RGA controller can monitor the current sent through the different traces and their corresponding temperatures, to precisely control the temperature of the zones (such as to the reflow temperatures of the corresponding solder balls), to permit late attach and removal of components to the corresponding zones. In some embodiments, the RGA controller measures (directly or indirectly, such as through closed loops of the heater traces) the temperatures of the corresponding zones (or BGA contacts or similar connection pads), to control the heater traces to heat the zones to the appropriate temperatures to attach or remove the corresponding components.

FIG. 2A is a plan view of an example RGA interposer 200 and RGA controller 250 for selectively heating zones (such as heating zone 220) of the RGA interposer 200, according to an embodiment of the present disclosure. FIG. 2B is an example cutaway plan view of the RGA interposer 200 of FIG. 2A, according to an embodiment of the present disclosure.

In FIGS. 2A-2B, the RGA interposer 200 is divided into heating zones such as heating zone 220. Each heating zone 220 has associated with it a set of RGA controller connector holes 210 (such as copper- or other conductive metal-plated through holes) for receiving heater leads 260 from RGA controller 250. For example, each heating zone 220 can have a corresponding pair (e.g., one power, one ground) of RGA controller connector holes 210 for receiving a corresponding pair of heater leads 260, such as 12 volt (12V) heater leads from the RGA controller 250. In one embodiment, the heater leads 260 connect to the corresponding pair of connector holes 210 using spring loaded insertion pins 270. In some embodiments, the voltage level of the heater leads 260 differs from 12V (such as 3V, 5V, or 6V, to name a few), or is adjustable (such as to any voltage between 1V and 12V, as an example range).

In further detail, each heating zone 220 has a corresponding set of BGA contacts 230 (such as the 48 BGA contacts 230 illustrated in the heating zone 220 of FIG. 2A). The set of BGA contacts 230 corresponds to the socket for a companion component to late attach or remove (e.g., via a BGA) the companion component, such as after the RGA interposer 200 is soldered to a MB. In addition, as illustrated in the top-down cutaway view of FIG. 2B, each heating zone 220 also has a corresponding heater trace 240 (such as a serpentine path of copper wire at an interconnect level of the RGA interposer 200) connected to the RGA controller connector holes 210. When the RGA controller 250 applies current to the heater leads 260 that are connected to the connector holes 210 via the insertion pins 270, resistance heating of the heating zone 220 takes place.

The RGA controller 250 can monitor indicators such as the temperature of or the current flowing through the heating zone 220, to bring the temperature to the corresponding reflow temperature to all the BGA to be attached or removed from the RGA interposer 200 or companion component, to allow the companion component to late attach to or remove from the RGA interposer 200. In some embodiments, the RGA controller 250 independently controls the RGA heaters traces using a closed-loop temperature control feedback to concurrently power, control, and read the temperature of each heater trace (or corresponding zone in the RGA).

In one or more embodiments, standard PCB fabrication techniques are used to fabricate the RGA interposer 200, including embedding copper traces 240 to serve as resistance heaters into one or more interconnect layers of the RGA interposer 200. These traces 240 are connected to the RGA controller 250 using the plated through holes 210, which are electrically connected to the internal copper heater traces 240. The RGA controller 250 selectively heats each heating zone 220 by driving current through the corresponding pair of connector holes 210 (such as with heater leads 260 and solid spring-loaded pins 270, including one power pin and one ground pin, inserted into the connector holes 210). In some embodiments, the RGA controller 250 delivers controlled monitored current into the heater traces 240, delivering sufficient current to each zone 220 being heated to bring the corresponding BGA contacts 230 to the desired temperature to attach or remove the corresponding companion component (or main component, for that matter). For instance, the traces 240 get hot due to the current flow, which is a closed loop controlled in the RGA controller 250.

It should be noted that while only one set of BGA contacts 230 is illustrated in FIG. 2A, the RGA interposer 200 can have hundreds or thousands of BGA contacts 230 corresponding to the different heating zones 220. In addition, there can be numerous heating zones 220, each having a corresponding set of connector holes 210 and heater trace 240. And while the connector holes 210 are illustrated as being on two sides of the periphery of RGA interposer 200, other embodiments are not so limited, and the connector holes (or other electrical contacts for controlling the heaters 240) can be on one or more sides or other locations (such as the interior) of the RGA interposer 200. In one embodiment, a main component (such as a CPU) has one or more corresponding heating zones in a central zone of the RGA interposer, and the main component is attached or removed like the companion components (such as using a CPU socket pattern for the BGA). In addition, the center of the RGA interposer can be a hole, such as for better ventilation and heat dissipation of an attached CPU package (whose socket can correspond to a perimeter of the CPU package surrounding the hole).

FIG. 3A is a perspective view of a computer system 300 including a central processing unit (CPU) package 370 attached to an example RGA interposer 320, according to an embodiment of the present disclosure. FIG. 3B is an example cross-sectional view of the CPU package 370 and RGA interposer 320 arrangement of FIG. 3A taken along the line B-B, according to an embodiment of the present disclosure. FIGS. 3A-3B show the RGA interposer 320 on the MB 310 with the CPU 370 attached to the interposer 320 and the embedded heaters 330 within the RGA interposer 320. The RGA interposer 320 is soldered to the MB 310 through a lower BGA 340 connecting a corresponding array of lower connection pads on the bottom of the RGA interposer 320 with an array of connection pads on the top of the MB 310. In addition, the CPU 370 is soldered to the RGA interposer 320 through an upper BGA 380 connecting a corresponding array of connection pads (e.g., a CPU socket) on the bottom of the CPU package 370 with an array of upper connection pads 360 on the top of the RGA interposer 320.

Further, the RGA interposer 320 has a vertical interconnect 350 (e.g., signal traces for carrying signals between vertically separated connection pads or contacts) to connect corresponding ones of the upper connection pads 360 to ones of the lower connection pads. This enables components to be late attached to the top of the RGA interposer 320, using the upper connection pads 360, vertical interconnect 350, and lower connection pads to connect some, all, or none of the corresponding connection pads on the bottom of the CPU 370 to similar connection pads of the MB 310 as if the CPU 370 was directly (or more directly) attached (e.g., through lower BGA 340) to the MB 310.

In addition to the RGA 320 being the interconnect between the MB 310 and the CPU 370, the RGA 320 can have signal traces (such as internal routing layers 440 of FIG. 4B) routed within the layers of the RGA interposer 320 to serve as a horizontal interconnect (e.g., signal traces for carrying signals between horizontally separated connection pads or contacts). These signal traces can be routed to other areas on the RGA interposer 320 without being connected to the MB 310. This allows for interconnecting of other components/chips/packages to the RGA interposer 320 without having to have the signals pass through the MB 310. With the inclusion of independent heater zones of the RGA 320, other components/chips/packages can be soldered down to the RGA interposer 320 (using the embedded heaters 330 of the corresponding zones) independently before or after the CPU 370 is attached (e.g., soldered) to the RGA 320 using its own corresponding set of embedded heaters 330.

FIG. 4A is a perspective view of a computer system 400 including a CPU package 460 and a companion chip package 480 (such as a GPU) attached to an example RGA interposer 420, according to an embodiment of the present disclosure. FIG. 4B is an example cross-sectional view of the arrangement of FIG. 4A taken along the line C-C, according to an embodiment of the present disclosure. FIGS. 4A-4B show the RGA interposer 420 on the MB 410 with the CPU 460 and companion chip 480 attached to the interposer 420 and the embedded heaters 430 within the RGA interposer 420. The RGA interposer 420 is soldered to the MB (or baseboard) 410, such as in a BGA pattern (or lower BGA) 450 corresponding to the connection pads at the bottom of the CPU package 460. The RGA interposer 420 also includes internal routing layers (or horizontal interconnect) 440 for connecting signals between the CPU 460 and the companion chip 480 (e.g., between horizontally separated connection pads) without having to go through the baseboard 410.

The RGA interposer 420 is soldered to the MB 410 through a lower BGA 450 connecting a corresponding array of lower connection pads on the bottom of the RGA interposer 420 with an array of connection pads or contacts on the top of the MB 410. In this embodiment, the connection pads and solder BGA corresponds to the CPU 460, so that communication from the MB to any component on the RGA interposer 420 goes through the CPU 460. In addition, the CPU 460 is soldered to the RGA interposer 420 through a first upper BGA 470 (e.g., corresponding to a CPU socket) connecting a corresponding array of connection pads on the bottom of the CPU package 460 with a first array of upper connection pads 465 on the top of the RGA interposer 420. Further, the companion chip 480 is soldered to the RGA interposer 420 through a second upper BGA 490 connecting a corresponding array of connection pads (or BGA contacts) on the bottom of the companion chip package 480 with a second array of upper connection pads 465 on the top of the RGA interposer 420.

Further, the RGA interposer 420 has a vertical interconnect 455 (e.g., signal traces for carrying signals between vertically separated connection pads) to connect corresponding ones of the upper connection pads 465 to ones of the lower connection pads. This enables components to be late attached to the top of the RGA interposer 420 using corresponding zones of the embedded heaters 430 to heat the corresponding ones of the upper connection pads to solder reflow temperatures. The late attached components use the upper connection pads 465, vertical interconnect 455, and lower connection pads to connect some, all, or none of the corresponding connection pads on the bottom of the CPU 460 (or other component) to similar connection pads of the MB 410 as if the CPU 460 (or other component) was directly (or more directly) attached (e.g., through lower BGA 450) to the MB 410.

FIGS. 4A-4B show an RGA interposer 420 with a CPU 460 and companion chip 480 soldered to the interposer 420. In other embodiments, this concept allows for multiple configurations of components to be attached to the RGA 420 in close proximity to the CPU die 460, giving the end user the advantage of producing a configurable multichip package on a standard platform. For example, the RGA interposer 420 could be made in a way that would allow for multiple memory chips and multiple FPGA packages to be attached in close proximity to the CPU 460. The user could then decide how many memory chips and FPGA packages they want to solder down on the RGA interposer 420 without having to have a special board configuration for every possible combination. In addition, faulty components such as faulty FPGAs or memory chips could be individually repaired, replaced, or removed without disturbing the rest of the RGA interposer 420, the MB 410, or the computer system 400.

FIG. 5 is a perspective view of a computer system 500 including an example configurable RGA interposer 520 partially populated with companion components, according to an embodiment of the present disclosure. In further detail, the computer system 500 includes a mother board 510, the RGA interposer 520 whose bottom side is soldered to the mother board 510, and a CPU 530 soldered to the top side of the RGA interposer 520. The companion components include a companion package 540 (such as a GPU) soldered to the top side of the RGA interposer 520, a companion chip 550 (such as an FPGA) soldered to the top side of the RGA interposer 520, and three memory chips 560 soldered to the top side of the RGA interposer 520. There is also a location 570 for an additional companion chip (such as another FPGA) and an unpopulated memory chip location 580 to add a fourth memory chip.

FIG. 5 shows this kind of arrangement where the customer can decide how many companion components they would like to have enabled for their MB 510. This provides the flexibility of late attach with the signal integrity and power performance of a BGA part. This can be developed to attach any combination of companion die or packages in conjunction with one or multiple CPUs 530 to arrive a family of products. In addition to companion die or packages this same concept can be used to attach any other value add features such as voltage regulators or other control circuitry, debug devices, security hardware, LAN chips, or switches on the RGA interposer 520, coupling those components closer to the processor when I/O routing would normally limit their proximity to the CPU 530. Furthermore, faulty or defective components can be repaired, removed, or replaced using similar techniques to the late attach, which greatly improves the resulting yield of such systems built from the RGA interposer 520.

Methodology

Figure 6:
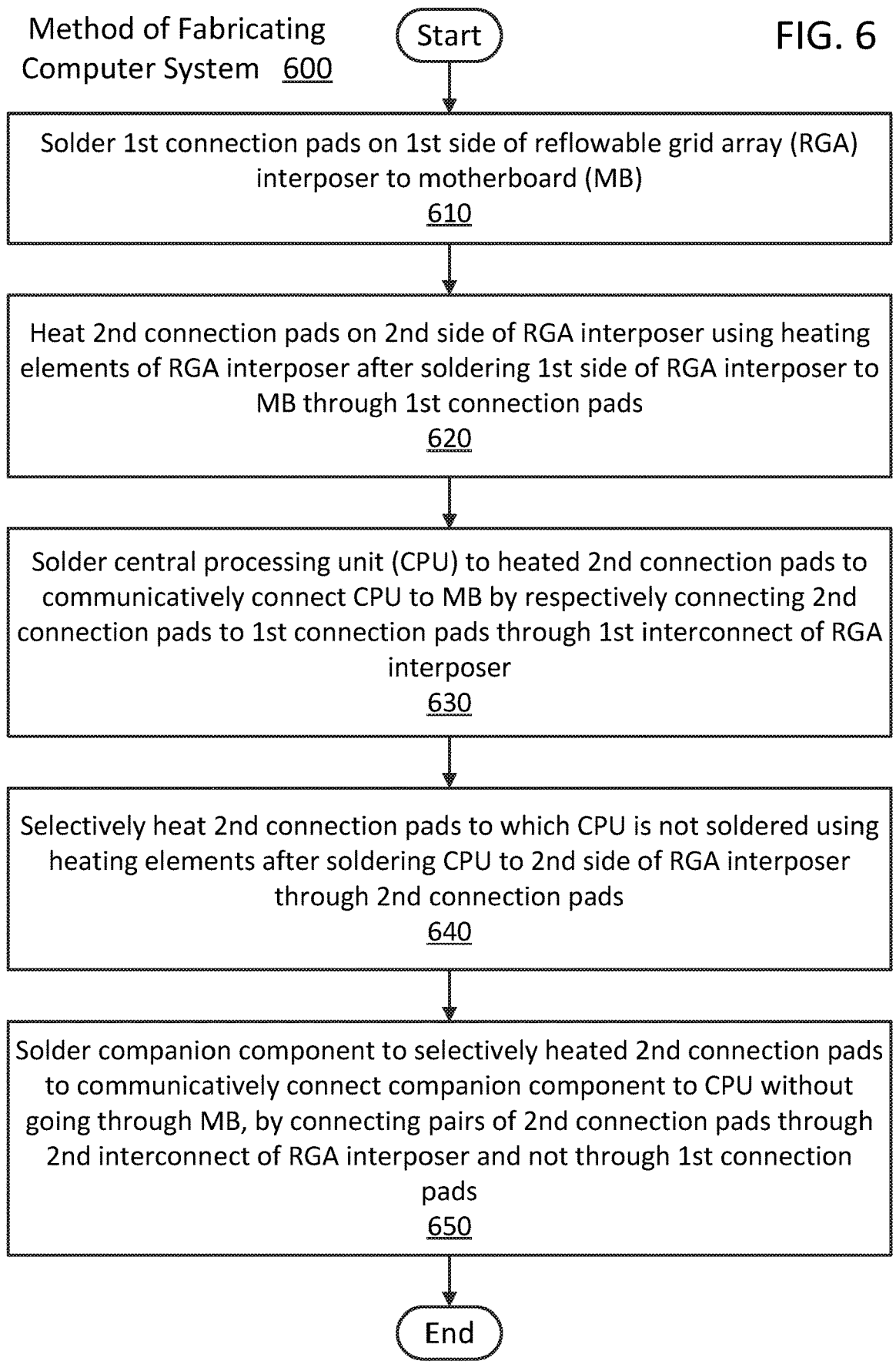
FIG. 6 is a flow diagram of an example method of fabricating a computer system, according to an embodiment of the present disclosure.

FIG. 6 is a flow diagram of an example method 600 of fabricating a computer system, according to an embodiment of the present disclosure. As can be seen, the computer systems 400 and 500 illustrated in FIGS. 4A, 4B, and 5 can be used to demonstrate embodiments of computer systems fabricated using the method 600, but any computer system of arbitrary configuration can benefit from the methodology. To this end, the methodology is not intended to be limited to any particular computer system configurations; rather, the methodology can be broadly applied to fabricate computer systems having RGA interposers to support late attach of companion components, as will be appreciated in light of this disclosure.

The method 600 includes soldering 610 (such as with lower BGA 450) first connection pads (such as lower connection pads) on a first side (such as the bottom) of a reflowable grid array (RGA) interposer (such as RGA interposer 420) to a motherboard (MB, such as MB or baseboard 410). The method 600 further includes heating 620 second connection pads (such as upper connection pads 465) on a second side (such as the top) of the RGA interposer using heating elements (such as embedded heaters 430) of the RGA interposer after soldering the first side of the RGA interposer to the MB through the first connection pads. In one embodiment, a zone of the heating elements (such as those embedded heaters 430 corresponding to the footprint of a CPU, such as CPU 460) is used to heat the second connection pads corresponding to the CPU.

The method 600 further includes soldering 630 (such as with first upper BGA 470) the CPU to the heated second connection pads to communicatively connect the CPU to the MB by respectively connecting ones of the second connection pads (such as the upper connection pads 465 corresponding to the CPU 460) to ones of the first connection pads (such as the lower connection pads corresponding to the lower BGA 450) through a first interconnect (such as vertical interconnect 455) of the RGA interposer. The method 600 further includes selectively heating 640 the second connection pads to which the CPU is not soldered (such as the upper connection pads 465 corresponding to second upper BGA 490) using the heating elements (such as those embedded heaters 430 corresponding to the footprint of a companion chip, such as companion chip 480) after soldering the CPU to the second side of the RGA interposer through the second connection pads.

The method 600 further includes soldering 650 (such as with the second upper BGA 490) a companion component (such as the companion chip 480, like a GPU) to the selectively heated second connection pads to communicatively connect the companion component to the CPU without going through the MB, by connecting pairs of the second connection pads through a second interconnect (such as the internal routing layers 440 or horizontal interconnect) of the RGA interposer and not through the first connection pads.

In one embodiment, the companion component is a first companion component (such as a first GPU) and the method 600 further includes selectively reheating the second connection pads to which the first companion component is soldered using the corresponding heating elements, and removing the first companion component from the selectively reheated second connection pads. The method 600 further includes soldering (such as through the second upper BGA 490) a second companion component (such as a second GPU, like a replacement GPU) to the selectively reheated second connection pads to communicatively connect the second companion component to the CPU through the second interconnect and not through the MB. For example, this technique can be used to effect a late repair of a faulty companion component.

In one embodiment, the CPU is a first CPU and the method 600 further includes selectively reheating the second connection pads to which the first CPU is soldered using the corresponding heating elements, and removing the first CPU from the selectively reheated second connection pads. The method 600 further includes soldering a second CPU (such as a replacement CPU) to the selectively reheated second connection pads to communicatively connect the second CPU to the MB through the first interconnect and to communicatively connect the second CPU to the companion component through the second interconnect and not through the MB. For example, this technique can be used to effect a late repair of a faulty CPU.

In one embodiment, the method 600 further includes further selectively heating the second connection pads to which the CPU and the companion component are not soldered, using the corresponding heating elements and after soldering the companion component to the second side of the RGA interposer through the second connection pads. The method 600 further includes soldering local components (such as FPGAs or memory chips) to the further selectively heated second connection pads to communicatively connect the local components to the CPU through the second interconnect and not through the MB. The method 600 further includes attaching remote components to the MB and not to the RGA interposer, to communicatively connect the remote components to the CPU through the MB and the first interconnect. For example, this technique can be used to solder components that need to be close to the CPU (local components) directly to the RGA interposer, and to attach other components (remote components) directly to the MB.

Computing System

Figure 7:
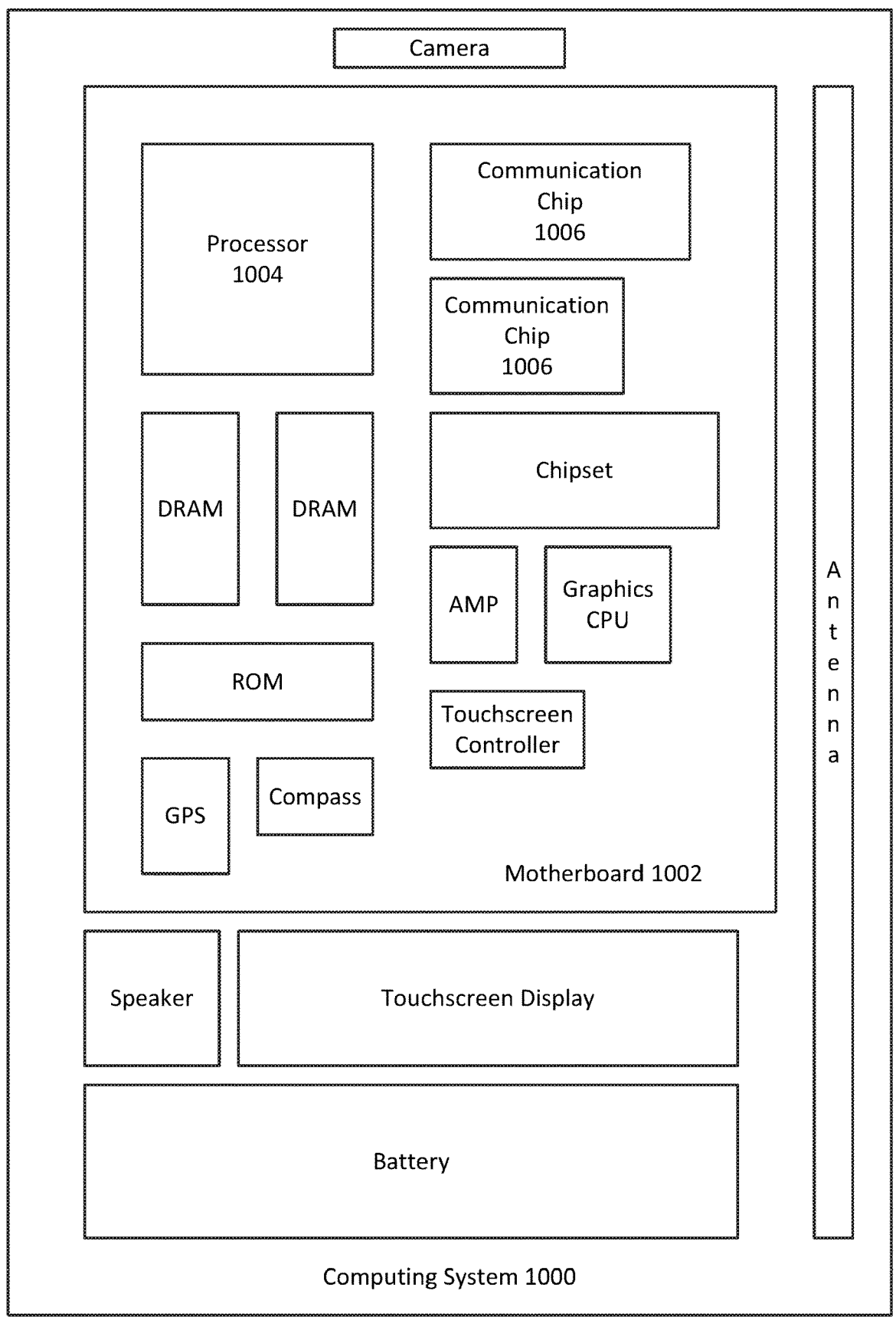
FIG. 7 illustrates a computing system implemented with one or more RGA interposers to support late attach of companion components, according to an embodiment of the present disclosure.

FIG. 7 illustrates a computing system implemented with one or more RGA interposers to support late attach of companion components, according to an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board or card-level assembly, whether a main board or a daughterboard mounted on a main board or the only board of system 1000, or a card installed in the chassis of system 1000.

Depending on its applications, computing system 1000 may include one or more other components that may or may not be physically and electrically coupled to the motherboard 1002. In an embodiment, these other components may include, but are not limited to, volatile memory (e.g., dynamic random access memory or DRAM), non-volatile memory (e.g., read only memory or ROM), a graphics processor (graphics CPU), a digital signal processor, a crypto processor, a chipset, an antenna, a display, a touchscreen display, a touchscreen controller, a battery, an audio codec, a video codec, a power amplifier (AMP), a global positioning system (GPS) device, a compass, an accelerometer, a gyroscope, a speaker, a camera, and a mass storage device (such as hard disk drive, compact disk (CD), digital versatile disk (DVD), and so forth).

Any of the components included in computing system 1000 may include one or more RGA interposers to support late attach of companion components, as variously described herein. In some example embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data using modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the processor 1004 is connected (e.g., soldered) to an RGA interposer to support late attach of companion components. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the communication chip 1006 is connected (e.g., soldered) to an RGA interposer to support late attach of companion components. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more RGA interposers to support late attach of companion components as variously provided herein. As will be appreciated in light of this disclosure, various embodiments of the present disclosure can be used to improve performance on products fabricated at any process node (e.g., in the micron range, or sub-micron and beyond) by allowing for the use of RGA interposers having any number of configurations.

FURTHER EXAMPLE EMBODIMENTS

The following examples pertain to further embodiments, from which numerous permutations and configurations will be apparent.

Example 1 is a computer system including: a motherboard (MB); a reflowable grid array (RGA) interposer including first connection pads in contact with one or more contacts of the MB, second connection pads on an opposite side of the RGA interposer as the first connection pads, and heating elements to heat the second connection pads; a central processing unit (CPU) in contact with a first set of the second connection pads; and a companion component in contact with a second set of the second connection pads, wherein the heating elements are further to attach and/or detach the CPU and the companion component to and/or from the respective first and second sets of the second connection pads in any order after the first connection pads are attached to the MB.

Example 2 includes the computer system of Example 1, further including solder to attach and electrically connect the first connection pads to the one or more contacts of the MB, the CPU to the first set of the second connection pads, and the companion component to the second set of the second connection pads.

Example 3 includes the computer system of any of the preceding Examples, wherein the RGA interposer further includes: a first interconnect connecting one of the second connection pads to one of the first connection pads, to enable communication between the CPU and the MB; and a second interconnect passing within the RGA interposer and connecting a pair of the second connection pads, to enable communication between the CPU and the companion component without going through the MB, the pair including a first pad from the first set of the second connection pads and a second pad from the second set of the second connection pads.

Example 4 includes the computer system of any of the preceding Examples, wherein the heating elements include resistance heater traces within the RGA interposer, and the second interconnect includes one or more signal traces in one or more internal routing layers of the RGA interposer.

Example 5 includes the computer system of any of the preceding Examples, further including one or more memory chips in contact with respective sets of the second connection pads, wherein the second interconnect is one of multiple second interconnects passing within the RGA interposer and connecting respective pairs of the second connection pads, and one or more of the additional second interconnects is or are to enable communication between the CPU and the memory chips without going through the MB.

Example 6 includes the computer system of any of the preceding Examples, further including one or more local components in contact with respective sets of the second connection pads, and one or more remote components attached to the MB and not to the RGA interposer, wherein the second interconnect is one of multiple second interconnects passing within the RGA interposer and connecting respective pairs of the second connection pads, and one or more of the additional second interconnects is or are to enable communication between the CPU and the local components without going through the MB, and the first interconnect is one of multiple first interconnects connecting respective ones of the second connection pads to respective ones of the first connection pads, and one or more of the additional first interconnects is or are to enable communication between the CPU and the remote components through the MB.

Example 7 includes the computer system of any of the preceding Examples, wherein the heating elements are further to selectively heat the second connection pads in zones corresponding to locations of components on the RGA interposer, to selectively attach and/or detach the components to and from the corresponding locations on the RGA interposer without attaching or detaching the first connection pads in contact with the MB.

Example 8 includes the computer system of any of the preceding Examples, wherein the heating elements include resistance heater traces within the RGA interposer, and the heater traces are arranged in serpentine patterns representing the zones of the second connection pads to and/or from which corresponding components can be selectively attached and/or detached after the first connection pads are attached to the MB.

Example 9 includes the computer system of any of the preceding Examples, wherein the second set of the second connection pads to which the companion component is in contact are not connected within the RGA interposer to the first connection pads.

Example 10 includes the computer system of any of the preceding Examples, wherein first and second ones of the heating elements are associated with the first and second sets of the second connection pads, respectively, and are not associated with the first connection pads in contact with the MB.

Example 11 includes the computer system of any of the preceding Examples, wherein the companion component includes a graphics processing unit (GPU) or a field-programmable gate array (FPGA).

Example 12 includes the computer system of any of Examples 1-10, wherein the companion component includes a voltage regulator, control circuitry, a debug device, security hardware, a local area network (LAN) chip, or a switch.

Example 13 is a reflowable grid array (RGA) interposer including: first connection pads to solder a first side of the RGA interposer to a motherboard (MB); second connection pads to solder components including a main component to a second side of the RGA interposer; first interconnect to communicatively connect the main component to the MB from the second connection pads to the first connection pads; second interconnect to communicatively connect the main component to others of the components through the second connection pads and not through the first connection pads; and heating elements to heat the second connection pads to selectively solder and remove the components to and from the second side of the RGA interposer after the first side of the RGA interposer is soldered to the MB.

Example 14 includes the RGA interposer of Example 13, wherein the heating elements are further to selectively solder and remove the components to and from the second side of the RGA interposer in any order after the first side of the RGA interposer is soldered to the MB.

Example 15 includes the RGA interposer of any of Examples 13-14, wherein the heating elements include resistance heater traces embedded in substrate material of the RGA interposer, and the second interconnect includes signal traces in internal routing layers of the RGA interposer substrate material.

Example 16 includes the RGA interposer of Example 15, wherein the heater traces are arranged in serpentine patterns representing zones of the second connection pads to and from which corresponding ones of the components can be selectively soldered and removed after the first side of the RGA interposer is soldered to the MB.

Example 17 includes the RGA interposer of any of Examples 13-16, wherein the second connection pads to solder the others of the components to the second side of the RGA interposer are not connected within the RGA interposer to the first connection pads.

Example 18 includes the RGA interposer of any of Examples 13-17, wherein the heating elements are further to selectively heat the second connection pads in zones corresponding to locations of the components on the second side of the RGA interposer, to selectively solder and remove the components to and from the corresponding locations on the second side of the RGA interposer after the first side of the RGA interposer is soldered to the MB.

Example 19 includes the RGA interposer of any of Examples 13-18, wherein the main component includes a central processing unit (CPU) and the others of the components include a graphics processing unit (GPU) or a field-programmable gate array (FPGA).

Example 20 is a computer system including the RGA interposer of any of Examples 13-19, the MB, a central processing unit (CPU), and memory chips, wherein the first side of the RGA interposer is soldered to the MB through the first connection pads, the main component includes the CPU soldered to the second side of the RGA interposer through the second connection pads, and the others of the components include the memory chips soldered to the second side of the RGA interposer through the second connection pads.

Example 21 includes the computer system of Example 20, wherein the CPU and the memory chips are soldered to the second side of the RGA interposer using the heating elements after the first side of the RGA interposer is soldered to the MB.

Example 22 is a method of fabricating a computer system, the method including: soldering first connection pads on a first side of a reflowable grid array (RGA) interposer to a motherboard (MB); heating second connection pads on a second side of the RGA interposer using heating elements of the RGA interposer after soldering the first connection pads to the MB; soldering a central processing unit (CPU) to the heated second connection pads to communicatively connect the CPU to the MB through a first interconnect of the RGA interposer from the second connection pads to the first connection pads; heating third connection pads on the second side of the RGA interposer using the heating elements after soldering the first connection pads to the MB; and soldering a companion component to the heated third connection pads to communicatively connect the companion component to the CPU through a second interconnect within the RGA interposer from the third connection pads to the second connection pads and not through the first connection pads.

Example 23 includes the method of Example 22, wherein the companion component is a first companion component, the method further including: reheating the third connection pads using the heating elements after soldering the first companion component to the heated third connection pads; removing the first companion component from the reheated third connection pads; and soldering a second companion component to the reheated third connection pads to communicatively connect the second companion component to the CPU through the second interconnect.

Example 24 includes the method of any of Examples 22-23, wherein the CPU is a first CPU, the method further including: reheating the second connection pads using the heating elements after soldering the first CPU to the heated second connection pads; removing the first CPU from the reheated second connection pads; and soldering a second CPU to the reheated second connection pads to communicatively connect the second CPU to the MB through the first interconnect and to the companion component through the second interconnect.

Example 25 includes the method of any of Examples 22-24, wherein the companion component is a first companion component, the method further including: heating fourth connection pads on the second side of the RGA interposer using the heating elements after soldering the first companion component; and soldering a second companion component to the heated fourth connection pads to communicatively connect the second companion component to the CPU through a third interconnect within the RGA interposer from the fourth connection pads to the second connection pads and not through the first connection pads.

Example 26 includes the method of any of Examples 22-25, wherein heating the third connection pads and soldering the companion component takes place before or after, and not during, heating the second connection pads and soldering the CPU.

Example 27 includes the method of any of Examples 22-26, further including: heating fourth connection pads on the second side of the RGA interposer using the heating elements after soldering the first connection pads to the MB; soldering local components to the heated fourth connection pads to communicatively connect the local components to the CPU through a third interconnect within the RGA interposer from the fourth connection pads to the second connection pads and not through the first connection pads; and attaching remote components to the MB and not to the RGA interposer, to communicatively connect the remote components to the CPU through the MB and the first interconnect.

Example 28 includes the method of any of Examples 22-27, further including: after soldering the CPU and soldering the companion component, selectively heating one of the second connection pads or the third connection pads using the heating elements while not heating the other of the second connection pads or the third connection pads; when the second connection pads are selectively heated, removing the CPU from the selectively heated second connection pads; and when the third connection pads are selectively heated, removing the companion component from the selectively heated third connection pads.

Example 29 is a reflowable grid array (RGA) interposer system including: an RGA interposer including first connection pads to solder a first side of the RGA interposer to a motherboard (MB), second connection pads to solder components to a second side of the RGA interposer, and heating elements to heat the second connection pads; and an RGA controller to selectively drive the heating elements to selectively heat the second connection pads in zones corresponding to locations of the components on the second side of the RGA interposer, to selectively solder and remove the components to and from the corresponding locations on the second side of the RGA interposer after the first side of the RGA interposer is soldered to the MB.

Example 30 includes the RGA interposer system of Example 29, wherein the RGA controller selectively drives the heating elements by selectively measuring temperatures corresponding to the zones, to selectively heat the zones to desired temperatures to selectively solder and remove the components to and from the corresponding locations on the second side of the RGA interposer after the first side of the RGA interposer is soldered to the MB.

Example 31 includes the RGA interposer system of any of Examples 29-30, wherein the components include a first component and a second component, and the RGA interposer further includes: first interconnect to communicatively connect the first component to the MB from the second connection pads to the first connection pads; and second interconnect to communicatively connect the first component to the second component through the second connection pads and not through the first connection pads.

Example 32 includes the RGA interposer system of Example 31, wherein the heating elements include resistance heater traces embedded in substrate material of the RGA interposer, and the second interconnect includes signal traces in internal routing layers of the RGA interposer substrate material.

Example 33 includes the RGA interposer system of Example 32, wherein the heater traces are arranged in serpentine patterns representing the zones of the second connection pads, and the RGA interposer includes contacts respectively connected to ends of the serpentine patterns.

Example 34 includes the RGA interposer system of Example 33, wherein the contacts include plated through holes in the RGA interposer substrate material, each serpentine pattern having two such through holes to be driven by electrical leads connected to the RGA controller.

Example 35 includes the RGA interposer system of any of Examples 31-34, wherein the second connection pads to solder the second component to the second side of the RGA interposer are not connected within the RGA interposer to the first connection pads.

Example 36 includes the RGA interposer system of any of Examples 31-35, wherein the first component includes a central processing unit (CPU) and the second component includes a graphics processing unit (GPU) or a field-programmable gate array (FPGA).

Example 37 is a reflowable grid array (RGA) interposer, including: a body having a first surface and a second surface opposite the first surface; first connection pads on the first surface of the body; second connection pads on the second surface of the body; one or more heating elements within the body and adjacent to the second connection pads; first interconnects within the body to connect one or more of the second connection pads to one or more of the first connection pads; and second interconnects within the body and to connect pairs of the second connection pads.

Example 38 is a motherboard assembly including a motherboard, a first microelectronics package, a second microelectronics package, and the RGA interposer of Example 37, wherein the first connection pads are in contact with contacts of the motherboard, the second connection pads are in contact with the first and second microelectronics packages, the first microelectronics package is configured to pass communication signals directly to the motherboard by the first interconnects, and the second microelectronics package is configured to pass communication signals directly to the first microelectronics package by the second interconnects but not to pass communication signals directly to the motherboard by the first interconnects.

Example 39 includes the motherboard assembly of Example 38, wherein the second microelectronics package is configured to pass communication signals indirectly to the motherboard by way of the second interconnects, the first microelectronics package, and the first interconnects.

Example 40 is a computing system including the motherboard assembly of any of Examples 38-39.

Example 41 is a smartphone including the motherboard assembly of Examples 38-39.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. A computer system comprising:
   a motherboard (MB);
   a reflowable grid array (RGA) interposer including first connection pads in contact with one or more contacts of the MB, second connection pads on an opposite side of the RGA interposer as the first connection pads, and heating elements to heat the second connection pads;
   a central processing unit (CPU) in contact with a first set of the second connection pads; and a companion component in contact with a second set of the second connection pads, wherein the heating elements are further to attach and/or detach the CPU and the companion component to and/or from the respective first and second sets of the second connection pads in any order after the first connection pads are attached to the MB, wherein the second set of the second connection pads to which the companion component is in contact are not connected within the RGA interposer to the first connection pads.

2. The computer system of claim 1, further comprising solder to attach and electrically connect the first connection pads to the one or more contacts of the MB, the CPU to the first set of the second connection pads, and the companion component to the second set of the second connection pads.

3. The computer system of claim 1, wherein the RGA interposer further includes:
   a first interconnect connecting one of the second connection pads to one of the first connection pads, to enable communication between the CPU and the MB; and
   a second interconnect passing within the RGA interposer and connecting a pair of the second connection pads, to enable communication between the CPU and the companion component without going through the MB, the pair including a first pad from the first set of the second connection pads and a second pad from the second set of the second connection pads.

4. The computer system of claim 3, wherein the heating elements comprise resistance heater traces within the RGA interposer, and the second interconnect comprises one or more signal traces in one or more internal routing layers of the RGA interposer.

5. The computer system of claim 3, further comprising one or more memory chips in contact with respective sets of the second connection pads, wherein the second interconnect is one of multiple second interconnects passing within the RGA interposer and connecting respective pairs of the second connection pads, and one or more of the additional second interconnects is or are to enable communication between the CPU and the memory chips without going through the MB.

6. The computer system of claim 3, further comprising one or more local components in contact with respective sets of the second connection pads, and one or more remote components attached to the MB and not to the RGA interposer, wherein the second interconnect is one of multiple second interconnects passing within the RGA interposer and connecting respective pairs of the second connection pads, and one or more of the additional second interconnects is or are to enable communication between the CPU and the local components without going through the MB, and the first interconnect is one of multiple first interconnects connecting respective ones of the second connection pads to respective ones of the first connection pads, and one or more of the additional first interconnects is or are to enable communication between the CPU and the remote components through the MB.

7. The computer system of claim 1, wherein the heating elements comprise resistance heater traces within the RGA interposer, and the heater traces are arranged in serpentine patterns representing zones of the second connection pads to and/or from which corresponding components can be selectively attached and/or detached after the first connection pads are attached to the MB.

8. The computer system of claim 1, wherein the heating elements are further to selectively heat the second connection pads in zones corresponding to locations of components on the RGA interposer, to selectively attach and/or detach the components to and from the corresponding locations on the RGA interposer without attaching or detaching the first connection pads in contact with the MB.

9. The computer system of claim 1, wherein first and second ones of the heating elements are associated with the first and second sets of the second connection pads, respectively, and are not associated with the first connection pads in contact with the MB.

10. The computer system of claim 1, wherein the companion component comprises a graphics processing unit (GPU) or a field-programmable gate array (FPGA).

11. The computer system of claim 1, wherein the companion component comprises a voltage regulator, control circuitry, a debug device, security hardware, a local area network (LAN) chip, or a switch.

12. A reflowable grid array (RGA) interposer comprising:
   first connection pads to solder a first side of the RGA interposer to a motherboard (MB); second connection pads to solder components including a main component to a second side of the RGA interposer;
   first interconnect to communicatively connect the main component to the MB from the second connection pads to the first connection pads; second interconnect to communicatively connect the main component to others of the components through the second connection pads and not through the first connection pads; and
   heating elements to heat the second connection pads to selectively solder and remove the components to and from the second side of the RGA interposer after the first side of the RGA interposer is soldered to the MB;
   wherein the second connection pads to solder the others of the components to the second side of the RGA interposer are not connected within the RGA interposer to the first connection pads.

13. The RGA interposer of claim 12, wherein the heating elements are further to selectively solder and remove the components to and from the second side of the RGA interposer in any order after the first side of the RGA interposer is soldered to the MB.

14. The RGA interposer of claim 12, wherein the heating elements comprise resistance heater traces embedded in substrate material of the RGA interposer, and the second interconnect comprises signal traces in internal routing layers of the RGA interposer substrate material.

15. The RGA interposer of claim 14, wherein the heater traces are arranged in serpentine patterns representing zones of the second connection pads to and from which corresponding ones of the components can be selectively soldered and removed after the first side of the RGA interposer is soldered to the MB.

16. The RGA interposer of claim 12, wherein the heating elements are further to selectively heat the second connection pads in zones corresponding to locations of the components on the second side of the RGA interposer, to selectively solder and remove the components to and from the corresponding locations on the second side of the RGA interposer after the first side of the RGA interposer is soldered to the MB.

17. A computer system comprising the RGA interposer of claim 12, the MB, a central processing unit (CPU), and memory chips, wherein the first side of the RGA interposer is soldered to the MB through the first connection pads, the main component comprises the CPU soldered to the second side of the RGA interposer through the second connection pads, and the others of the components comprise the memory chips soldered to the second side of the RGA interposer through the second connection pads.

18. A reflowable grid array (RGA) interposer system comprising:
   an RGA interposer including first connection pads to solder a first side of the RGA interposer to a motherboard (MB), second connection pads to solder components to a second side of the RGA interposer, heating elements to heat the second connection pads, pairs of connectors wherein each pair of the connectors is connected to a different one of the heating elements; and
   an RGA controller connected to each of the connectors, the RGA controller to selectively drive the heating elements to selectively heat the second connection pads in zones corresponding to locations of the components on the second side of the RGA interposer by selecting to drive current through a corresponding one or more of the pair of connectors for the selectively heated one or more of the second connection pads, to selectively solder and remove the components to and from the corresponding locations on the second side of the RGA interposer after the first side of the RGA interposer is soldered to the MB.

19. The RGA interposer system of claim 18, wherein the RGA controller selectively drives the heating elements by selectively measuring temperatures corresponding to the zones, to selectively heat the zones to desired temperatures to selectively solder and remove the components to and from the corresponding locations on the second side of the RGA interposer after the first side of the RGA interposer is soldered to the MB.

20. The RGA interposer system of claim 18, wherein the components comprise a first component and a second component, and the RGA interposer further includes: first interconnect to communicatively connect the first component to the MB from the second connection pads to the first connection pads; and second interconnect to communicatively connect the first component to the second component through the second connection pads and not through the first connection pads.

21. An assembly, comprising:
   a body having a first surface and a second surface opposite the first surface;
   first connection pads on the first surface of the body, wherein the first connection pads are connected to a motherboard;
   second connection pads on the second surface of the body, wherein the second connection pads are configured to connect externally to one or more integrated circuit packages, wherein a first plurality of the second connection pads is laterally spaced apart from a second plurality of the second connection pads, wherein the second plurality of the second connection pads is not coupled to the first plurality of the second connection pads;
   heating elements within the body;
   first interconnects within the body to connect one or more of the second connection pads to one or more of the first connection pads; and
   second interconnects within the body and to connect pairs of the second connection pads.

22. A motherboard assembly comprising a motherboard, a first microelectronics package, a second microelectronics package, and a reflowable grid array (RGA), wherein:
   the RGA comprises a body having a first surface and a second surface opposite the first surface, first connection pads on the first surface of the body, second connection pads on the second surface of the body, one or more heating elements within the body and adjacent to the second connection pads, first interconnects within the body to connect one or more of the second connection pads to one or more of the first connection pads, and second interconnects within the body and to connect pairs of the second connection pads; and
   wherein the first connection pads are in contact with contacts of the motherboard, the second connection pads are in contact with the first and second microelectronics packages, the first microelectronics package is configured to pass communication signals directly to the motherboard by the first interconnects, and the second microelectronics package is configured to pass communication signals directly to the first microelectronics package by the second interconnects but not to pass communication signals directly to the motherboard by the first interconnects, wherein the second microelectronics package is configured to pass communication signals indirectly to the motherboard by way of the second interconnects, the first microelectronics package, and the first interconnects.

23. A computer system comprising:
   a motherboard (MB);
   a reflowable grid array (RGA) interposer including first connection pads in contact with one or more contacts of the MB, second connection pads on an opposite side of the RGA interposer as the first connection pads;
   heating elements to heat the second connection pads;
   a central processing unit (CPU) in contact with a first set of the second connection pads and a second set of the connection pads;
   a companion component in contact with a second set of the second connection pads; wherein the heating elements are further to attach and/or detach the CPU and the companion component to and/or from the respective first and second sets of the second connection pads in any order after the first connection pads are attached to the MB;
   a remote component in contact with the MB; and
   a first interconnect integrated into the RGA, wherein the first interconnect connects a first subset of the first set of the second connection pads to a first set of one or more of the first connection pads to enable communication between the remote component and the CPU through the MB.

24. The computer system of claim 23, further comprising:

a second interconnect integrated into the RGA, wherein the second interconnect connects a second subset of the first set of the second connection pads to a first subset of the second set of the second connection pads to enable communication between the companion component and the CPU without going through the MB; and a third inteconnect integrated into the RGA, wherein the third interconnect connects a third subset of the first set of the second connection pads to a second set of one or more of the first connection pads to connect the CPU to the MB but not to the remote component.

\* \* \* \* \*